(12) United States Patent
Inoue et al.

(10) Patent No.: US 6,696,736 B2
(45) Date of Patent: Feb. 24, 2004

(54) PIEZOELECTRIC SUBSTRATE FOR SURFACE ACOUSTIC WAVE DEVICE, AND SURFACE ACOUSTIC WAVE DEVICE

(75) Inventors: Kenji Inoue, Tokyo (JP); Katsuo Sato, Tokyo (JP); Hiroki Morikoshi, Tokyo (JP); Jun Sato, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 10/332,958

(22) PCT Filed: Dec. 6, 2001

(86) PCT No.: PCT/JP01/10680
§ 371 (c)(1),
(2), (4) Date: Jan. 14, 2003

(87) PCT Pub. No.: WO02/071609
PCT Pub. Date: Sep. 12, 2002

(65) Prior Publication Data
US 2003/0146481 A1 Aug. 7, 2003

(30) Foreign Application Priority Data
Mar. 7, 2001 (JP) ........................................ 2001-062801

(51) Int. Cl.$^7$ .............................................. H01L 29/82
(52) U.S. Cl. ........................................ 257/416; 257/613
(58) Field of Search .................................. 257/416, 613

(56) References Cited

U.S. PATENT DOCUMENTS 6,029,324 A * 2/2000 Wixforth .................... 257/416
6,153,961 A * 11/2000 Jian et al. ................. 310/313 A

OTHER PUBLICATIONS

Takeda et al., "Growth and Characterization of New Langasite–type Substitutional Piezoelectric Crystals", 30p–YN–5, Abstracts of 45$^{th}$ Collective Lecture Meeting on Applied Physics, Mar. 1998 (w/partial translation).

"Saw Device and its Applications", Chapter I: Fundamentals, Section 4.1.2: Effective Electromechanical Coupling Coefficient of Surface Waves, edited by Electronics Materials Manufacturers Association of Japan (EMAJ), published by The Nikkan Kogyo Shimbun, Ltd., 1978 (w/partial translation).

Chai et al., "A New Class of Ordered Langasite Structure Compounds", Proceedings of 2000 IEEE/IEA International Frequency Control Symposium and Exhibition, pp. 163–168.

Mill et al., "New Compounds with a $Ca_3Ga_2Ge_2O_{14}$–Type Structure: $A_3XY_3Z_2O_{14}$ (A=Ca, Sr, Ba, Pb; X=Sb, Nb, Ta; Y=Ga, Al, Fe, In; Z=Si, Ge)", Russian Journal of Inorganic Chemistry, vol. 43, No. 8, pp. 1168–1175, 1998.

Fedorets et al., "Surface Acoustic Wave Characteristics on $LA_3GA_5SIO_{14}$ Crystals", IEEE International Frequency Control Symposium, pp. 816–820, 1997.

* cited by examiner

Primary Examiner—Ngân V. Ngô
(74) Attorney, Agent, or Firm—Oliff & Berridge, PLC

(57) ABSTRACT

The surface acoustic wave device comprises a piezoelectric substrate (1) and a pair of interdigitated electrodes (2) provided on one main surface of the piezoelectric substrate (1). As the material of the piezoelectric substrate (1), a single crystal belonging to the point group 32, having a crystal structure of $Ca_3Ga_2Ge_4O_{14}$ type, containing Ca, Nb, Ga, Si and O as main components, and being represented by the chemical formula $Ca_3NbGa_3Si_2O_{14}$ is used. The cut angle of the substrate (1) and the propagation direction can be selected as appropriate to thereby realize the substrate (1) which has a large electromechanical coupling coefficient that is effective to achieve a wider passband and a low SAW velocity that is effective to reduce the size of a surface acoustic wave device.

18 Claims, 18 Drawing Sheets

| φ (°) | θ (°) | ψ (°) | SAW velocity (m/s) | k² (%) |
|---|---|---|---|---|
| 0 | 30 | 0 | 2964 | 0.18 |
| 0 | 30 | 15 | 2979 | 0.19 |
| 0 | 30 | 30 | 3019 | 0.21 |
| 0 | 30 | 45 | 3067 | 0.22 |
| 0 | 30 | 60 | 3105 | 0.11 |
| 0 | 30 | 75 | 3138 | 0.00 |
| 0 | 50 | 0 | 2936 | 0.34 |
| 0 | 50 | 15 | 2958 | 0.33 |
| 0 | 50 | 30 | 3002 | 0.38 |
| 0 | 50 | 45 | 3040 | 0.37 |
| 0 | 50 | 60 | 3071 | 0.22 |
| 0 | 50 | 75 | 3116 | 0.07 |
| 0 | 70 | 0 | 2928 | 0.41 |
| 0 | 70 | 15 | 2941 | 0.33 |
| 0 | 70 | 30 | 2962 | 0.28 |
| 0 | 70 | 45 | 2982 | 0.22 |
| 0 | 70 | 60 | 3005 | 0.14 |
| 0 | 70 | 75 | 3042 | 0.07 |
| 0 | 90 | 0 | 2934 | 0.29 |
| 0 | 90 | 15 | 2935 | 0.25 |
| 0 | 90 | 30 | 2941 | 0.17 |
| 0 | 90 | 45 | 2955 | 0.08 |
| 0 | 90 | 60 | 2977 | 0.03 |
| 0 | 90 | 75 | 3001 | 0.01 |

FIG. 2

| $\phi$ (°) | $\theta$ (°) | $\psi$ (°) | SAW velocity (m/s) | $k^2$ (%) |
|---|---|---|---|---|
| 0 | 100 | 60 | 2985 | 0 |
| 0 | 100 | 70 | 3005 | 0 |
| 0 | 100 | 80 | 3026 | 0.01 |
| 0 | 120 | 60 | 3036 | 0.04 |
| 0 | 120 | 70 | 3070 | 0.13 |
| 0 | 120 | 80 | 3111 | 0.25 |
| 0 | 140 | 60 | 3090 | 0.09 |
| 0 | 140 | 70 | 3124 | 0.23 |
| 0 | 140 | 80 | 3153 | 0.29 |
| 0 | 160 | 60 | 3058 | 0.04 |
| 0 | 160 | 70 | 3074 | 0.03 |
| 0 | 160 | 80 | 3087 | 0.01 |

FIG. 3

| φ (°) | θ (°) | ψ (°) | SAW velocity (m/s) | $k^2$ (%) |
|---|---|---|---|---|
| 10 | 30 | −75 | 3139 | 0.06 |
| 10 | 30 | −60 | 3110 | 0.25 |
| 10 | 30 | −45 | 3065 | 0.27 |
| 10 | 30 | −30 | 3013 | 0.21 |
| 10 | 45 | −75 | 3128 | 0.14 |
| 10 | 45 | −60 | 3092 | 0.39 |
| 10 | 45 | −45 | 3053 | 0.45 |
| 10 | 45 | −30 | 3003 | 0.33 |
| 10 | 60 | −75 | 3084 | 0.18 |
| 10 | 60 | −60 | 3040 | 0.29 |
| 10 | 60 | −45 | 3008 | 0.34 |
| 10 | 60 | −30 | 2975 | 0.30 |

FIG. 4

| φ (°) | θ (°) | ψ (°) | SAW velocity (m/s) | $k^2$ (%) |
|---|---|---|---|---|
| 10 | 110 | −85 | 3085 | 0.10 |
| 10 | 110 | −75 | 3050 | 0.11 |
| 10 | 110 | −65 | 3021 | 0.07 |
| 10 | 125 | −75 | 3108 | 0.37 |
| 10 | 125 | −65 | 3071 | 0.23 |
| 10 | 140 | −75 | 3147 | 0.45 |
| 10 | 140 | −65 | 3112 | 0.31 |
| 10 | 155 | −85 | 3140 | 0.02 |
| 10 | 155 | −75 | 3123 | 0.10 |
| 10 | 155 | −65 | 3095 | 0.11 |

FIG. 5

| φ (°) | θ (°) | ψ (°) | SAW velocity (m/s) | $k^2$ (%) |
|---|---|---|---|---|
| 15 | 30 | −75 | 3142 | 0.11 |
| 15 | 30 | −60 | 3112 | 0.30 |
| 15 | 30 | −45 | 3062 | 0.27 |
| 15 | 30 | −30 | 3011 | 0.19 |
| 15 | 45 | −75 | 3130 | 0.22 |
| 15 | 45 | −60 | 3094 | 0.46 |
| 15 | 45 | −45 | 3050 | 0.44 |
| 15 | 45 | −30 | 2999 | 0.29 |
| 15 | 60 | −75 | 3085 | 0.23 |
| 15 | 60 | −60 | 3041 | 0.32 |
| 15 | 60 | −45 | 3006 | 0.32 |
| 15 | 60 | −30 | 2972 | 0.26 |

FIG. 6

| φ (°) | θ (°) | ψ (°) | SAW velocity (m/s) | $k^2$ (%) |
|---|---|---|---|---|
| 15 | 110 | −85 | 3084 | 0.11 |
| 15 | 110 | −75 | 3050 | 0.14 |
| 15 | 110 | −65 | 3021 | 0.09 |
| 15 | 125 | −75 | 3109 | 0.41 |
| 15 | 125 | −65 | 3072 | 0.29 |
| 15 | 140 | −75 | 3149 | 0.49 |
| 15 | 140 | −65 | 3115 | 0.40 |
| 15 | 155 | −85 | 3140 | 0.02 |
| 15 | 155 | −75 | 3124 | 0.10 |
| 15 | 155 | −65 | 3098 | 0.13 |

FIG. 7

| φ (°) | θ (°) | ψ (°) | SAW velocity (m/s) | $k^2$ (%) |
|---|---|---|---|---|
| 25 | 30 | −60 | 3111 | 0.34 |
| 25 | 30 | −40 | 3038 | 0.20 |
| 25 | 45 | −80 | 3142 | 0.22 |
| 25 | 45 | −60 | 3095 | 0.51 |
| 25 | 45 | −40 | 3026 | 0.28 |
| 25 | 60 | −80 | 3106 | 0.28 |
| 25 | 60 | −60 | 3042 | 0.33 |
| 25 | 60 | −40 | 2990 | 0.21 |

FIG. 8

| $\phi$ (°) | $\theta$ (°) | $\psi$ (°) | SAW velocity (m/s) | $k^2$ (%) |
|---|---|---|---|---|
| 25 | 110 | −75 | 3049 | 0.17 |
| 25 | 110 | −65 | 3108 | 0.43 |
| 25 | 110 | −55 | 3150 | 0.47 |
| 25 | 125 | −75 | 3127 | 0.11 |
| 25 | 125 | −65 | 3022 | 0.15 |
| 25 | 125 | −55 | 3074 | 0.39 |
| 25 | 140 | −75 | 3121 | 0.52 |
| 25 | 140 | −65 | 3102 | 0.15 |
| 25 | 140 | −55 | 2997 | 0.11 |
| 25 | 155 | −75 | 3041 | 0.28 |
| 25 | 155 | −65 | 3083 | 0.37 |
| 25 | 155 | −55 | 3072 | 0.15 |

FIG. 9

| φ (°) | θ (°) | ψ (°) | SAW velocity (m/s) | $k^2$ (%) |
|---|---|---|---|---|
| 10 | 30 | -30 | 3013 | 0.21 |
| 10 | 30 | 0 | 2966 | 0.18 |
| 10 | 30 | 30 | 3023 | 0.17 |
| 10 | 60 | -30 | 2975 | 0.30 |
| 10 | 60 | 0 | 2932 | 0.38 |
| 10 | 60 | 30 | 2985 | 0.33 |
| 10 | 90 | -30 | 2939 | 0.13 |
| 10 | 90 | 0 | 2935 | 0.28 |
| 10 | 90 | 30 | 2944 | 0.19 |
| 15 | 30 | -30 | 3011 | 0.19 |
| 15 | 30 | 0 | 2967 | 0.18 |
| 15 | 30 | 30 | 3024 | 0.14 |
| 15 | 60 | -30 | 2972 | 0.26 |
| 15 | 60 | 0 | 2934 | 0.36 |
| 15 | 60 | 30 | 2986 | 0.29 |
| 15 | 90 | -30 | 2939 | 0.11 |
| 15 | 90 | 0 | 2937 | 0.27 |
| 15 | 90 | 30 | 2946 | 0.20 |
| 30 | 30 | -30 | 3007 | 0.14 |
| 30 | 30 | 0 | 2973 | 0.13 |
| 30 | 30 | 30 | 3021 | 0.03 |
| 30 | 60 | -30 | 2968 | 0.15 |
| 30 | 60 | 0 | 2940 | 0.25 |
| 30 | 60 | 30 | 2980 | 0.15 |
| 30 | 90 | -30 | 2938 | 0.08 |
| 30 | 90 | 0 | 2940 | 0.26 |
| 30 | 90 | 30 | 2948 | 0.20 |

FIG. 10

(Area 1-2) SAW velocity [m/s]

(Area 1-2) Electromechanical coupling coefficient [%]

(Area 3-2) SAW velocity [m/s]

(Area 3-2) Electromechanical coupling coefficient [%]

(Area 4-1) SAW velocity [m/s]

(Area 4-1) Electromechanical coupling coefficient [%]

(Area 4-2) SAW velocity [m/s]

(Area 4-2) Electromechanical coupling coefficient [%]

| Symbol | Composition | Cut angle | Propagation direction | SAW velocity (m/s) | $k^2$ (%) |
|---|---|---|---|---|---|
| 128LN | LiNbO$_3$ | 128°-rotated Y | X | 3992 | 5.5 |
| 64LN | LiNbO$_3$ | 64°-rotated Y | X | 4742 | 11.3 |
| 36LT | LiTaO$_3$ | 36°-rotated Y | X | 4212 | 4.7 |
| LT112 | LiTaO$_3$ | X | 112°-rotated Y | 3288 | 0.64 |
| ST quartz | quartz | ST | X | 3158 | 0.14 |

FIG. 27

PRIOR ART

PIEZOELECTRIC SUBSTRATE FOR SURFACE ACOUSTIC WAVE DEVICE, AND SURFACE ACOUSTIC WAVE DEVICE

TECHNICAL FIELD

The present invention relates to a piezoelectric substrate which is used for a surface acoustic wave device having interdigitated electrodes formed on the piezoelectric substrate, and to the surface acoustic wave device.

In recent years, mobile communication terminals such as cellular phones have rapidly become widespread. Such terminals are desired to be reduced in size and weight from the viewpoint of portability. In order to achieve reduction in size and weight of the terminals, electronic parts used therein are required to be reduced in size and weight, too. For that purpose, surface acoustic wave devices, i.e., surface acoustic wave filters, which are advantageous for reduction in size and weight, are often employed in high- and intermediate-frequency portions of the terminals. Such surface acoustic wave devices are formed with interdigitated electrodes on a piezoelectric substrate, for the purpose of exciting, receiving, reflecting or propagating surface acoustic waves.

Important characteristics of a piezoelectric substrate used for a surface acoustic wave device include the surface wave velocity of the surface acoustic wave (hereinafter referred to as SAW velocity), the temperature coefficient of a center frequency in the case of filters or of a resonant frequency in the case of resonators (hereinafter referred to as the temperature coefficient of frequency), and $k^2$, i.e., the square of the electromechanical coupling coefficient (hereinafter $k^2$ is also referred to as the electromechanical coupling coefficient).

FIG. 27 illustrates the types and characteristics of the substrates which have been conventionally used as a piezoelectric substrate for a surface acoustic wave device so far. Hereinafter, these piezoelectric substrates are distinguished from each other using the symbols in FIG. 27.

As can be seen from FIG. 27, the conventionally used piezoelectric substrates are broadly classifiable into two groups: one including 128LN, 64LN, and 36LT that have a high SAW velocity and a large electromechanical coupling coefficient, and the other including LT112 and ST quartz that have a relatively low SAW velocity and a small electromechanical coupling coefficient. The piezoelectric substrates having a high SAW velocity and a large electromechanical coupling coefficient (128LN, 64LN, and 36LT) are used for surface acoustic wave filters in high-frequency portions of terminal devices, for example. On the other hand, the piezoelectric substrates having a relatively low SAW velocity and a small electromechanical coupling coefficient (LT112 and ST quartz) are used for surface acoustic wave filters in intermediate-frequency portions of terminal devices, for example. The reasons for this are as follows.

That is, for a surface acoustic wave filter, its center frequency is substantially proportional to the SAW velocity of the piezoelectric substrate used therein and substantially inversely proportional to the width of an electrode digit of the interdigitated electrodes formed on the substrate. For this reason, to form filters to be used for high-frequency circuit portions, it is preferable to use a substrate having a high SAW velocity. In addition to this, since a wide passband width of 20 MHz or more is required for the filters used for high-frequency portions of terminal devices, it is also necessary for the filters to have a large electromechanical coupling coefficient.

On the other hand, a frequency band ranging from 70 to 300 MHz is used as the intermediate frequency of mobile terminals. When a filter having a center frequency within this frequency band is formed by using a surface acoustic wave device, if a substrate having a high SAW velocity is used as the piezoelectric substrate, it would be necessary to significantly increase the width of an electrode digit formed on the substrate in response to the decreased amount of the center frequency, as compared with that of a filter used for a high-frequency circuit portion. This may present a problem that the surface acoustic wave device itself is increased in size.

For that reason, LT112 and ST quartz having a low SAW velocity are used as the piezoelectric substrates for intermediate-frequency surface acoustic wave filters. In particular, ST quartz is preferable because its first order temperature coefficient of frequency is zero. ST quartz can only form a filter having a narrow passband, due to its small electromechanical coupling coefficient. However, since the function of intermediate-frequency filters is to allow only signals of one narrow channel to pass through, the small electromechanical coupling coefficient has not presented a serious problem.

However, in recent years, from the viewpoints of effective use of frequency resources, compatibility to digital data communications and so on, a digital mobile communication system has been developed and put to practical use to rapidly become widespread. The passband width of this system is very wide, that is, several hundred kHz to several MHz. In the case where an intermediate-frequency filter having such a wide passband is formed using a surface acoustic wave filter, it is difficult to implement it with an ST quartz substrate that has a small electromechanical coupling coefficient.

On the other hand, to enhance size reductions of mobile terminals to improve its portability, it is necessary to reduce the mounting area of the intermediate-frequency surface acoustic wave filter. However, both ST quartz and LT112, which are considered to be suitable for the intermediate-frequency surface acoustic wave filter, have a SAW velocity higher than 3000 m/s (second), which poses limitations in size reductions thereof.

DISCLOSURE OF THE INVENTION

It is an object of the present invention to provide a piezoelectric substrate, for use in a surface acoustic wave device, having a large electromechanical coupling coefficient that is effective to achieve a wider passband and having a low SAW velocity that is effective to reduce the size of s surface acoustic wave device, and to provide a surface acoustic wave device which can achieve a wider passband and size reductions.

A piezoelectric substrate for a surface acoustic wave device according to the invention is intended for use for a surface acoustic wave device having an interdigitated electrode formed on the piezoelectric substrate, and is composed of a single crystal belonging to the point group 32, having a crystal structure of $Ca_3Ga_2Ge_4O_{14}$ type, containing Ca, Nb, Ga, Si and O as main components, and being represented by the chemical formula $Ca_3NbGa_3Si_2O_{14}$.

According to the piezoelectric substrate for a surface acoustic wave device of the invention, it is possible to obtain a large electromechanical coupling coefficient that is effective to achieve a wider passband and a low SAW velocity that is effective to reduce the size of a surface acoustic wave device.

A surface acoustic wave device according to the invention has an interdigitated electrode formed on a piezoelectric substrate, the piezoelectric substrate being composed of a single crystal belonging to the point group 32, having a crystal structure of $Ca_3Ga_2Ge_4O_{14}$ type, containing Ca, Nb, Ga, Si and O as main components, and being represented by the chemical formula $Ca_3NbGa_3Si_2O_{14}$.

The surface acoustic wave device of the invention allows use of a piezoelectric substrate having a large electromechanical coupling coefficient that is effective to achieve a wider passband and a low SAW velocity that is effective to reduce the size of a surface acoustic wave device. As a result, it is possible to widen the passband and reduce the size of the surface acoustic wave device.

In the surface acoustic wave device or the piezoelectric substrate for the surface acoustic wave device of the invention, when a cut angle at which the piezoelectric substrate is cut out of the single crystal and a propagation direction of a surface acoustic wave are represented in terms of Eulerian angles ($\phi$, $\theta$, $\psi$), $\phi$, $\theta$, and $\psi$ may be in any of the following areas.

[Area 1-1]
$\phi=-5°$ to $5°$,
$\theta=30°$ to $90°$, and
$\psi=0°$ to $75°$

[Area 1-2]
$\phi=-5°$ to $5°$,
$\theta=110°$ to $155°$, and
$\psi=60°$ to $80°$

[Area 2-1]
$\phi=5°$ to $10°$ (excluding $5°$),
$\theta=30°$ to $60°$, and
$\psi=-75°$ to $-30°$

[Area 2-2]
$\phi=5°$ to $10°$ (excluding $5°$),
$\theta=110°$ to $155°$, and
$\psi=-85°$ to $-65°$

[Area 3-1]
$\phi=10°$ to $20°$ (excluding $10°$),
$\theta=30°$ to $60°$, and
$\psi=-75°$ to $-30°$

[Area 3-2]
$\phi=10°$ to $20°$ (excluding $10°$),
$\theta=110°$ to $155°$, and
$\psi=-85°$ to $-65°$

[Area 4-1]
$\phi=20°$ to $30°$ (excluding $20°$),
$\theta=30°$ to $60°$, and
$\psi=-80°$ to $-40°$

[Area 4-2]
$\phi=20°$ to $30°$ (excluding $20°$),
$\theta=110°$ to $155°$, and
$\psi=-75°$ to $-55°$

[Area 5]
$\phi=5°$ to $30°$ (excluding $5°$),
$\theta=30°$ to $90°$, and
$\psi=-30°$ to $30°$ Other objects, features and advantages of the invention will be sufficiently apparent from the following description.

BRIEF DESCRIPTION OF THE DRAWINGS

FIG. 2 is an explanatory diagram showing the test results corresponding to area 1-1 of the embodiment of the invention.

FIG. 3 is an explanatory diagram showing the test results corresponding to area 1-2 of the embodiment of the invention.

FIG. 4 is an explanatory diagram showing the test results corresponding to area 2-1 of the embodiment of the invention.

FIG. 5 is an explanatory diagram showing the test results corresponding to area 2-2 of the embodiment of the invention.

FIG. 6 is an explanatory diagram showing the test results corresponding to area 3-1 of the embodiment of the invention.

FIG. 7 is an explanatory diagram showing the test results corresponding to area 3-2 of the embodiment of the invention.

FIG. 8 is an explanatory diagram showing the test results corresponding to area 4-1 of the embodiment of the invention.

FIG. 9 is an explanatory diagram showing the test results corresponding to area 4-2 of the embodiment of the invention.

FIG. 10 is an explanatory diagram showing the test results corresponding to area 5 of the embodiment of the invention.

FIG. 27 is an explanatory diagram showing the types and characteristics of substrates conventionally used as a piezoelectric substrate for a surface acoustic wave device.

BEST MODE FOR CARRYING OUT THE INVENTION

An embodiment of the present invention will now be described in detail with reference to the drawings.

Figure 1:
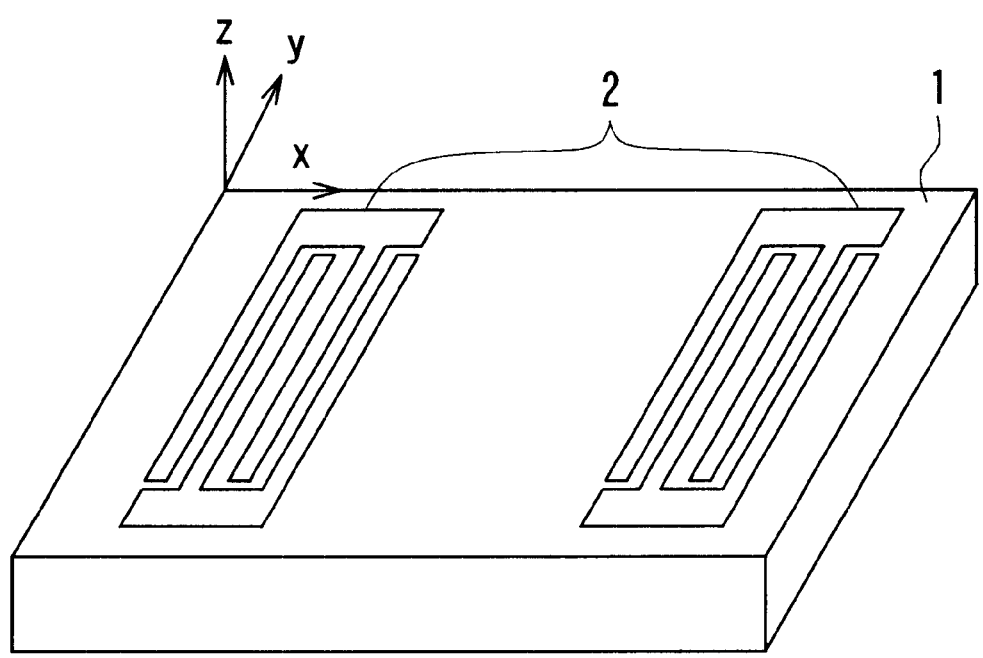
FIG. 1 is a perspective view showing an example of a configuration of a surface acoustic wave device according to an embodiment of the invention.

FIG. 1 is a perspective view showing an example of a configuration of a surface acoustic wave device according to the embodiment of the invention. The surface acoustic wave device comprises a piezoelectric substrate 1 and a pair of interdigitated electrodes 2 provided on one main surface of the piezoelectric substrate 1. The shape, the number and the arrangements of the electrodes 2 may be any conventional ones.

As the material of the piezoelectric substrate 1, used is a single crystal belonging to the point group 32, having a crystal structure of $Ca_3Ga_2Ge_4O_{14}$ type, containing Ca, Nb, Ga, Si and O as main components, and being represented by the chemical formula $Ca_3NbGa_3Si_2O_{14}$.

The x, y, and z axes shown in FIG. 1 are perpendicular to one another. The x and y axes lie in in-plane directions of the substrate 1, and the x axis defines a propagation direction of a surface acoustic wave. The z axis is perpendicular to the plane of the substrate 1 and defines a cut angle (cut plane) of the single crystal substrate. The relationship between these x, y, and Z axes and the crystal axes X, Y, Z of the single crystal, i.e., the cut angle of the substrate cut out of the single crystal and the propagation direction of the surface acoustic wave can be represented in terms of Eulerian angles (ϕ, θ, ψ).

In the surface acoustic wave device of this embodiment, when the cut angle and the propagation direction are represented in terms of Eulerian angles (100, θ, ψ), ϕ, θ and ψ are found in any of the following areas 1-1, 1-2, 2-1, 2-2, 3-1, 3-2, 4-1, 4-2, and 5.

[Area 1-1]

ϕ=−5° to 5°,

θ=30° to 90°, and

ψ=0°–75°

A preferable area within the area 1-1 is as follows.

ϕ=−5° to 5°,

θ=60° to 75°, and

ψ=0° to 10°

In the area 1-1, there are combinations of ϕ, θ and ψ wherein the SAW velocity of the substrate 1 is 3100 m/s or less, which is lower than that of ST quartz, and the electromechanical coupling coefficient $k^2$ of the substrate 1 is as sufficiently large as 0.2% or more. In the aforementioned preferable area within the area 1-1, there are combinations of ϕ, θ and ψ wherein the electromechanical coupling coefficient $k^2$ is 0.3% or more, which is sufficiently larger than that of ST quartz.

[Area 1-2]

ϕ=−5° to 5°,

θ=110° to 155°, and

ψ=60° to 80°

In the area 1-2, there are combinations of ϕ, θ and ψ wherein the SAW velocity of the substrate 1 is 3200 m/s or less, which is on substantially the same level as that of ST quartz, and the electromechanical coupling coefficient $k^2$ of the substrate 1 is as sufficiently large as 0.2% or more.

[Area 2-1]

ϕ=5° to 10° (excluding 5°),

θ=30° to 60°, and

ψ=−75° to −30°

A preferable area within the area 2-1 is as follows.

ϕ=5° to 10° (excluding 5°),

θ=35° to 55°, and

ψ=−60° to −35°

In the area 2-1, there are combinations of ϕ, θ and ψ wherein the SAW velocity of the substrate 1 is 3200 m/s or less, which is on substantially the same level as that of ST quartz, and the electromechanical coupling coefficient $k^2$ of the substrate 1 is as sufficiently large as 0.2% or more. In the aforementioned preferable area within the area 2-1, there are combinations of ϕ, θ and ψ wherein the electromechanical coupling coefficient $k^2$ is 0.4% or more, which is sufficiently larger than that of ST quartz.

[Area 2-2]

ϕ=5° to 10° (excluding 5°),

θ=110° to 155°, and

ψ=−85° to −65°

A preferable area within the area 2-2 is as follows.

ϕ=5° to 10° (excluding 5°),

θ=120° to 150°, and

ψ=−80° to −70°

In the area 2-2, there are combinations of ϕ, θ and ψ wherein the SAW velocity of the substrate 1 is 3100 m/s or less, which is lower than that of ST quartz, and the electromechanical coupling coefficient $k^2$ of the substrate 1 is as sufficiently large as 0.2% or more. In the aforementioned preferable area within the area 2-2, there are combinations of ϕ, θ and ψ wherein the electromechanical coupling coefficient $k^2$ is 0.4% or more, which is sufficiently larger than that of ST quartz.

[Area 3-1]
 φ=10° to 20° (excluding 10°),
 θ=30° to 60°, and
 ψ=−75° to −30°
A preferable area within the area 3-1 is as follows.
 φ=10° to 20° (excluding 10°),
 θ=35° to 55°, and
 ψ=−65° to −40°

In the area 3-1, there are combinations of φ, θ and ψ wherein the SAW velocity of the substrate 1 is 3100 m/s or less, which is lower than that of ST quartz, and the electromechanical coupling coefficient $k^2$ of the substrate 1 is as sufficiently large as 0.2% or more. In the aforementioned preferable area within the area 3-1, there are combinations of φ, θ and ψ wherein the electromechanical coupling coefficient $k^2$ is 0.4% or more, which is sufficiently larger than that of ST quartz.

[Area 3-2]
 φ=10° to 20° (excluding 10°),
 θ=110° to 155°, and
 ψ=−85° to −65°
A preferable area within the area 3-2 is as follows.
 φ=10° to 20° (excluding 10°),
 θ=125° to 150°, and
 ψ=−80° to −65°

In the area 3-2, there are combinations of φ, θ and ψ wherein the SAW velocity of the substrate 1 is 3200 m/s or less, which is on substantially the same level as that of ST quartz, and the electromechanical coupling coefficient $k^2$ of the substrate 1 is as sufficiently large as 0.2% or more. In the aforementioned preferable area within the area 3-2, there are combinations of φ, θ and ψ wherein the electromechanical coupling coefficient $k^2$ is 0.4% or more, which is sufficiently larger than that of ST quartz.

[Area 4-1]
 φ=20° to 30° (excluding 20°),
 θ=30° to 60°, and
 ψ=−80° to −40°
A preferable area within the area 4-1 is as follows.
 φ=20° to 30° (excluding 20°),
 θ=30° to 55°, and
 ψ=−75° to −50°

In the area 4-1, there are combinations of φ, θ and ψ wherein the SAW velocity of the substrate 1 is 3200 m/s or less, which is on substantially the same level as that of ST quartz, and the electromechanical coupling coefficient $k^2$ of the substrate 1 is as sufficiently large as 0.2% or more. In the aforementioned preferable area within the area 4-1, there are combinations of φ, θ and ψ wherein the electromechanical coupling coefficient $k^2$ is 0.5% or more, which is sufficiently larger than that of ST quartz.

[Area 4-2]
 φ=20° to 30° (excluding 20°),
 θ=110° to 155°, and
 ψ=−75° to −55°
A preferable area within the area 4-2 is as follows.
 φ=20° to 30° (excluding 20°),
 θ=125° to 150°, and
 ψ=−75° to −60°

In the area 4-2, there are combinations of φ, θ and ψ wherein the SAW velocity of the substrate 1 is 3200 m/s or less, which is on substantially the same level as that of ST quartz, and the electromechanical coupling coefficient $k^2$ of the substrate 1 is as sufficiently large as 0.2% or more. In the aforementioned preferable area within the area 4-2, there are combinations of φ, θ and ψ wherein the electromechanical coupling coefficient $k^2$ is 0.4% or more, which is sufficiently larger than that of ST quartz.

[Area 5]
 φ=5° to 30° (excluding 5°),
 θ=30° to 90°, and
 ψ=−30° to 30°

In the area 5, there are combinations of φ, θ and ψ wherein the SAW velocity of the substrate 1 is 3100 m/s or less, which is on substantially the same level as that of ST quartz, and the electromechanical coupling coefficient $k^2$ of the substrate 1 is as sufficiently large as 0.2% or more.

Since the single crystal of $Ca_3NbGa_3Si_2O_{14}$ is of the trigonal system, there are combinations of Eulerian angles that are crystallographically equivalent to each other owing to the symmetry of crystals. For example, (0°, 90°, 17°) included in the area 1-1 is equivalent to (0°, 90°, −17°), (60°, 90°, ±17°) and (120°, 90°, ±17°). Furthermore, (0°, 90°, 17°) is equivalent to (240°, 90°, ±17°) and (360°, 90°, ±17°).

The $Ca_3NbGa_3Si_2O_{14}$ may be the one having oxygen defects. Additionally, this single crystal may contain inevitable impurities, for example, Al, Zr, Fe, Ce, Nd, La, Pt, Ca and the like.

EXAMPLE

An example of a surface acoustic wave device according to the embodiment is described below. First, description is given of a method for fabricating the piezoelectric substrate 1 for a surface acoustic wave of this example. As the material of the piezoelectric substrate 1, used was a single crystal belonging to the point group 32, having a crystal structure of $Ca_3Ga_2Ge_4O_{14}$ type, containing Ca, Nb, Ga, Si and O as main components, and being represented by the chemical formula $Ca_3NbGa_3Si_2O_{14}$. The single crystal was grown through the CZ method employing high-frequency heating, i.e., a rotating pull-up method. The resulting single crystal was cut at a cut angle described later, into a substrate to serve as the piezoelectric substrate 1 for a surface acoustic wave device.

Next, a method for fabricating a surface acoustic wave device to be tested is described below. As shown in FIG. 1, the surface acoustic wave device to be tested has a structure in which the interdigitated electrodes 2 for input/output are formed on a surface of the piezoelectric substrate 1 cut out of the aforementioned single crystal. The interdigitated electrodes 2 were formed through processing an aluminum (Al) film, formed by vapor deposition, into a predetermined shape by photo-etching. The cycle of an electrode digit corresponding to the wavelength λ of a surface acoustic wave was 60 μm, the number of pairs was 20, the overlap width (the length of the overlapping portion) was 60 λ (3600 μm), and the film thickness was 0.3 μm.

Description will now be given of tests that were carried out to verify the validity of the areas 1-1, 1-2, 2-1, 2-2, 3-1, 3-2, 4-1, 4-2, and 5. In these tests, a plurality of surface acoustic wave devices to be tested were prepared with the cut angle of the substrate 1 and the propagation direction of surface acoustic waves varied, so as to determine the SAW velocity and the electromechanical coupling coefficient $k^2$ in each of the devices. The SAW velocity was determined by multiplying a measured value of the center frequency among the filter characteristics of the surface acoustic wave device having the interdigitated electrodes 2 configured as described above, by the wavelength of the surface acoustic wave. On the other hand, the electromechanical coupling coefficient $k^2$ was determined by measuring the two-terminal admittance of either one of the aforementioned interdigitated electrodes 2 for input/output, specifically, the one for input, for example, and then employing the Smith's equivalent circuit method in accordance with the real part (conductance) and the imaginary part (susceptance) of the admittance. This method is described in detail in, for example, the publication entitled "SAW Device and Its Applications", Chapter I: Fundamentals, Section 4.1.2, Effective Electromechanical Coupling Coefficient of Surface Waves (edited by Electronics Materials Manufacturers Association of Japan (EMAJ), published by The Nikkan Kogyo Shimbun, Ltd., 1978). For the aforementioned characteristics, measurement was performed with the ambient temperature of the devices kept at 25° C.

Figure 11:
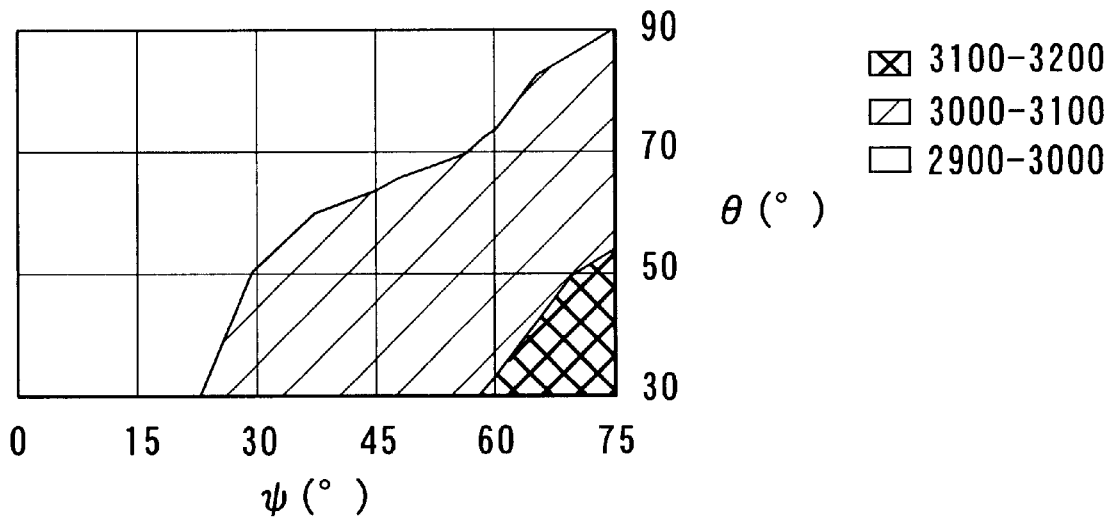
FIG. 11 is an explanatory diagram illustrating the relationship between $\theta$ and $\psi$, and the SAW velocity expressed in a two-dimensional manner based upon the test results shown in FIG. 2.
Figure 12:
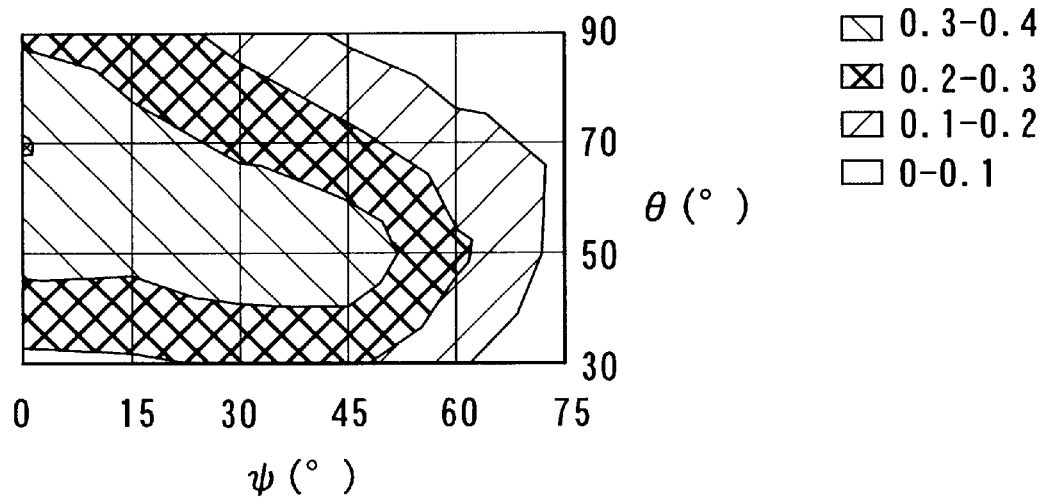
FIG. 12 is an explanatory diagram illustrating the relationship between $\theta$ and $\psi$, and the electromechanical coupling coefficient expressed in a two-dimensional manner based upon the test results shown in FIG. 2.

FIG. 2 is an explanatory diagram showing the test results corresponding to the area 1-1. FIG. 11 is an explanatory diagram illustrating the relationship between θ and ψ, and the SAW velocity expressed in a two-dimensional manner based upon the test results shown in FIG. 2. FIG. 12 is an explanatory diagram illustrating the relationship between θ and ψ, and the electromechanical coupling coefficient $k^2$ expressed in a two-dimensional manner based upon the test results shown in FIG. 2.

As apparent from FIG. 2, FIG. 11 and FIG. 12, when the angle φ is 0°, there are combinations of φ, θ, and ψ wherein the electromechanical coupling coefficient $k^2$ is 0.2% or more and the SAW velocity is 3100 m/s or less within the range where the angle θ 30 to 90° and the angle ψ is 0 to 75°. Even if φ varies within the range of 0±5°, the same combinations as above are found. Furthermore, when the angle φ is 0°, there are combinations of φ, θ, and ψ wherein the electromechanical coupling coefficient $k^2$ is 0.3% or more within the range where the angle θ is 60 to 75° and the angle ψ is 0 to 10°. Even if φ varies within the range of 0±5°, the same combinations as above are found.

Now, shown below is the fact that the characteristics of the substrate 1 and the surface acoustic wave device are not significantly affected by certain variations in φ. From FIG. 2, when (φ, θ, ψ)=(0°, 70°, 0°), the SAW velocity is 2928 m/s and the electromechanical coupling coefficient $k^2$ is 0.41%. In comparison to this, when (φ, θ, ψ)=(±5°, 70°, 0°), the SAW velocity is 2929 m/s and the electromechanical coupling coefficient $k^2$ is 0.40%. The same holds true for the other areas described below.

Figure 13:
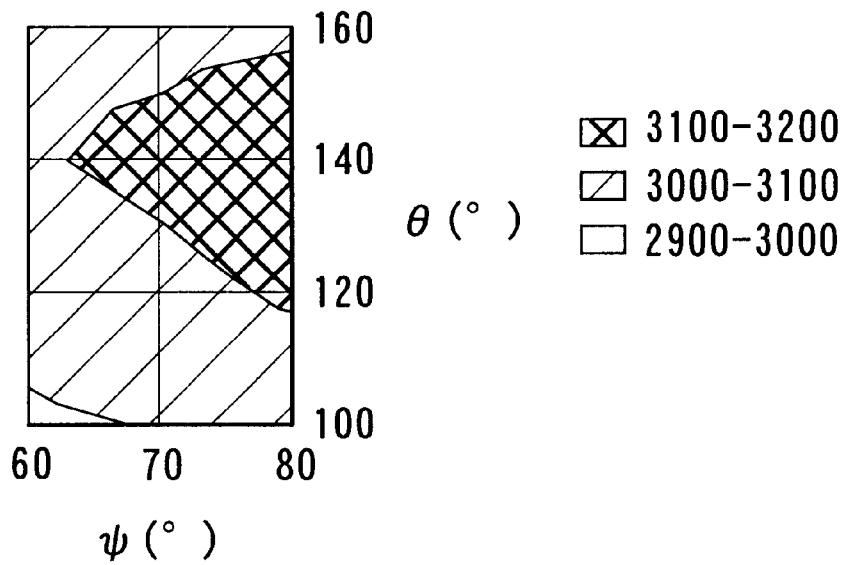
FIG. 13 is an explanatory diagram illustrating the relationship between $\theta$ and $\psi$, and the SAW velocity expressed in a two-dimensional manner based upon the test results shown in FIG. 3.
Figure 14:
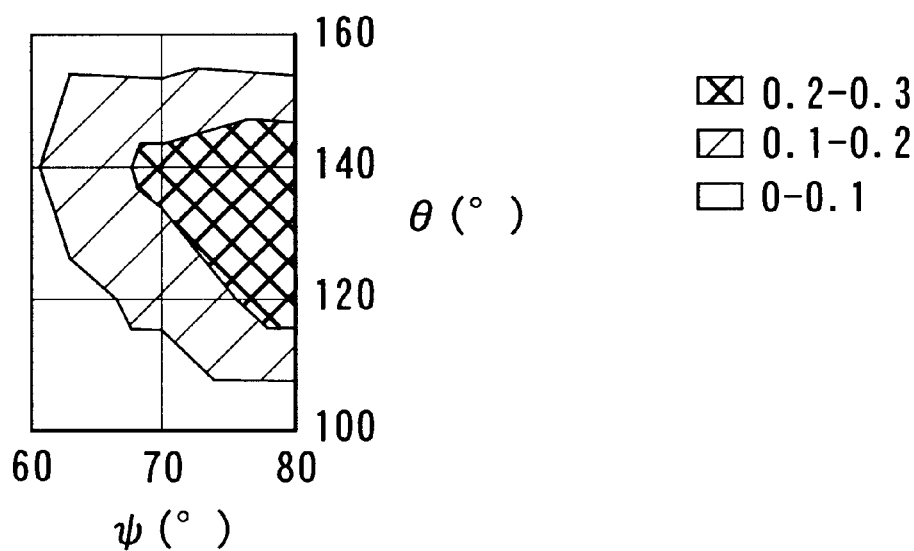
FIG. 14 is an explanatory diagram illustrating the relationship between $\theta$ and $\psi$, and the electromechanical coupling coefficient expressed in a two-dimensional manner based upon the test results shown in FIG. 3.

FIG. 3 is an explanatory diagram showing the test results corresponding to the area 1-2. FIG. 13 is an explanatory diagram illustrating the relationship between θ and ψ, and the SAW velocity expressed in a two-dimensional manner based upon the test results shown in FIG. 3. FIG. 14 is an explanatory diagram illustrating the relationship between θ and ψ, and the electromechanical coupling coefficient $k^2$ expressed in a two-dimensional manner based upon the test results shown in FIG. 3.

As apparent from FIG. 3, FIG. 13 and FIG. 14, when the angle φ is 0°, there are combinations of φ, θ, and ψ wherein the electromechanical coupling coefficient $k^2$ is 0.2% or more and the SAW velocity is 3200 m/s or less within the range where the angle θ is 110 to 155° and the angle ψ is 60 to 80°. Even if φ varies within the range of 0±5°, the same combinations as above are found.

Figure 15:
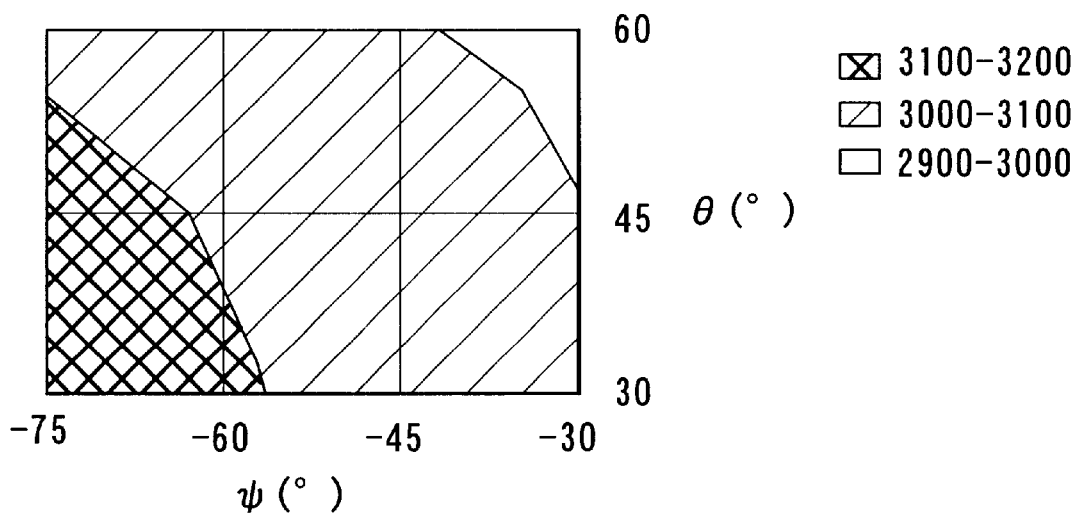
FIG. 15 is an explanatory diagram illustrating the relationship between $\theta$ and $\psi$, and the SAW velocity expressed in a two-dimensional manner based upon the test results shown in FIG. 4.
Figure 16:
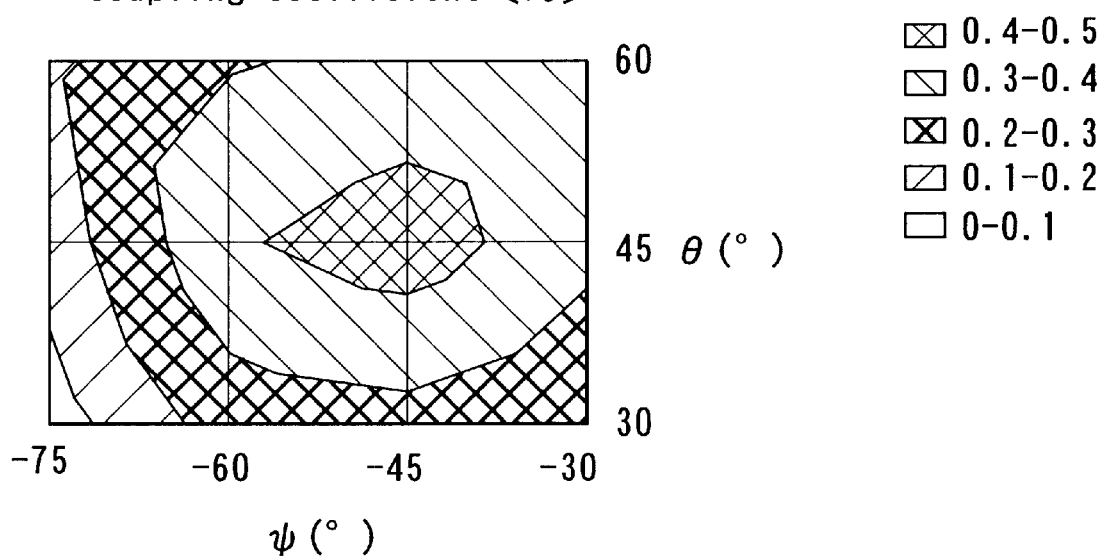
FIG. 16 is an explanatory diagram illustrating the relationship between $\theta$ and $\psi$, and the electromechanical coupling coefficient expressed in a two-dimensional manner based upon the test results shown in FIG. 4.

FIG. 4 is an explanatory diagram showing the test results corresponding to the area 2-1. FIG. 15 is an explanatory diagram illustrating the relationship between θ and ψ, and the SAW velocity expressed in a two-dimensional manner based upon the test results shown in FIG. 4. FIG. 16 is an explanatory diagram illustrating the relationship between θ and ψ, and the electromechanical coupling coefficient $k^2$ expressed in a two-dimensional manner based upon the test results shown in FIG. 4.

As apparent from FIG. 4, FIG. 15 and FIG. 16, when the angle φ is 10°, there are combinations of φ, θ, and ψ wherein the electromechanical coupling coefficient $k^2$ is 0.2% or more and the SAW velocity is 3200 m/s or less within the range where the angle θ is 30 to 60° and the angle ψ is −75 to −30°. Even if φ varies within the range of 7.5±2.5°, the same combinations as above are found. Furthermore, when the angle φ is 10°, there are combinations of φ, θ, and ψ wherein the electromechanical coupling coefficient $k^2$ is 0.4% or more within the range where the angle θ is 35 to 55° and the angle ψ is −60 to −35°. Even if φ varies within the range of 7.5±2.5°, the same combinations as above are found.

Figure 17:
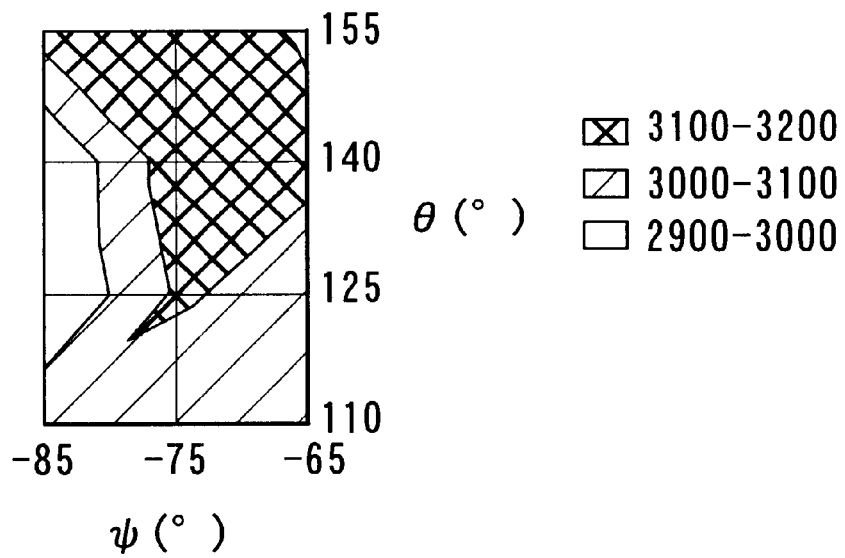
FIG. 17 is an explanatory diagram illustrating the relationship between $\theta$ and $\psi$, and the SAW velocity expressed in a two-dimensional manner based upon the test results shown in FIG. 5.
Figure 18:
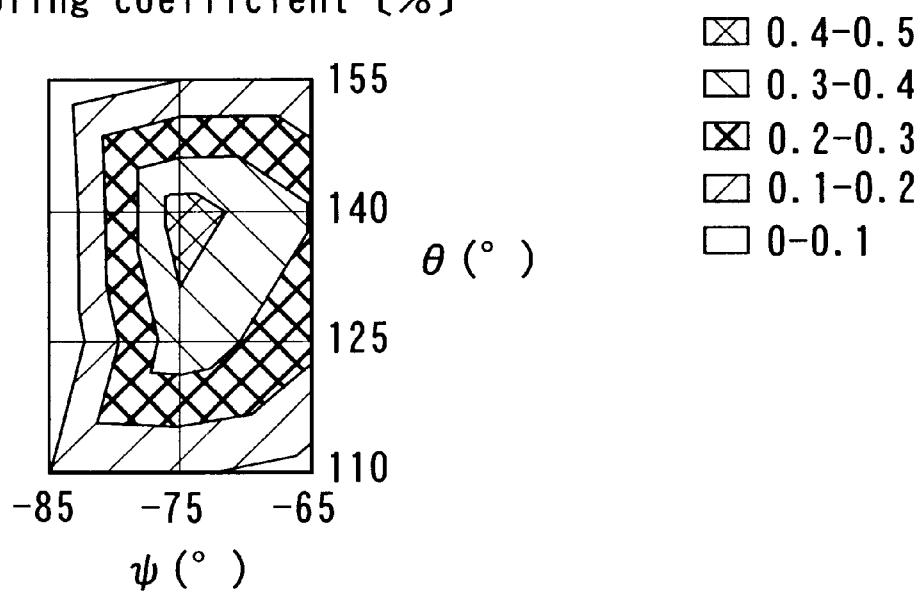
FIG. 18 is an explanatory diagram illustrating the relationship between $\theta$ and $\psi$, and the electromechanical coupling coefficient expressed in a two-dimensional manner based upon the test results shown in FIG. 5.

FIG. 5 is an explanatory diagram showing the test results corresponding to the area 2-2. FIG. 17 is an explanatory diagram illustrating the relationship between θ and ψ, and the SAW velocity expressed in a two-dimensional manner based upon the test results shown in FIG. 5. FIG. 18 is an explanatory diagram illustrating the relationship between θ and ψ, and the electromechanical coupling coefficient $k^2$ expressed in a two-dimensional manner based upon the test results shown in FIG. 5.

As apparent from FIG. 5, FIG. 17 and FIG. 18, when the angle φ is 10°, there are combinations of φ, θ, and ψ wherein the electromechanical coupling coefficient $k^2$ is 0.2% or more and the SAW velocity is 3100 m/s or less within the range where the angle φ is 110 to 155° and the angle ψ is −85 to −65°. Even if φ varies within the range of 7.5±2.5°, the same combinations as above are found. Furthermore, when the angle φ is 10°, there are combinations of φ, θ, and ψ wherein the electromechanical coupling coefficient $k^2$ is 0.4% or more within the range where the angle θ is 120 to 150° and the angle ψ is −80 to −70°. Even if φ varies within the range of 7.5±2.5°, the same combinations as above are found.

Figure 19:
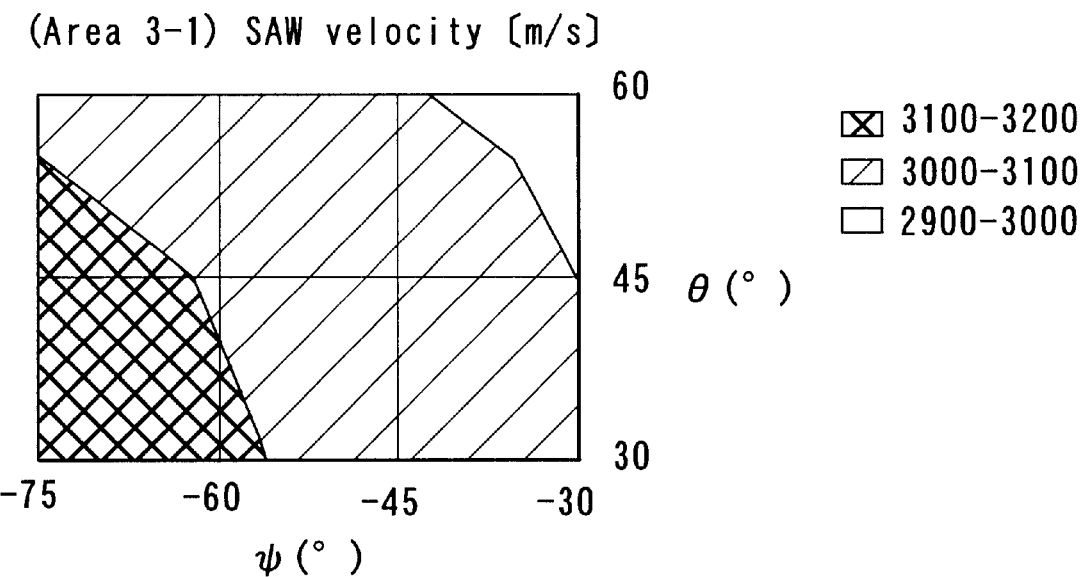
FIG. 19 is an explanatory diagram illustrating the relationship between $\theta$ and $\psi$, and the SAW velocity expressed in a two-dimensional manner based upon the test results shown in FIG. 6.
Figure 20:
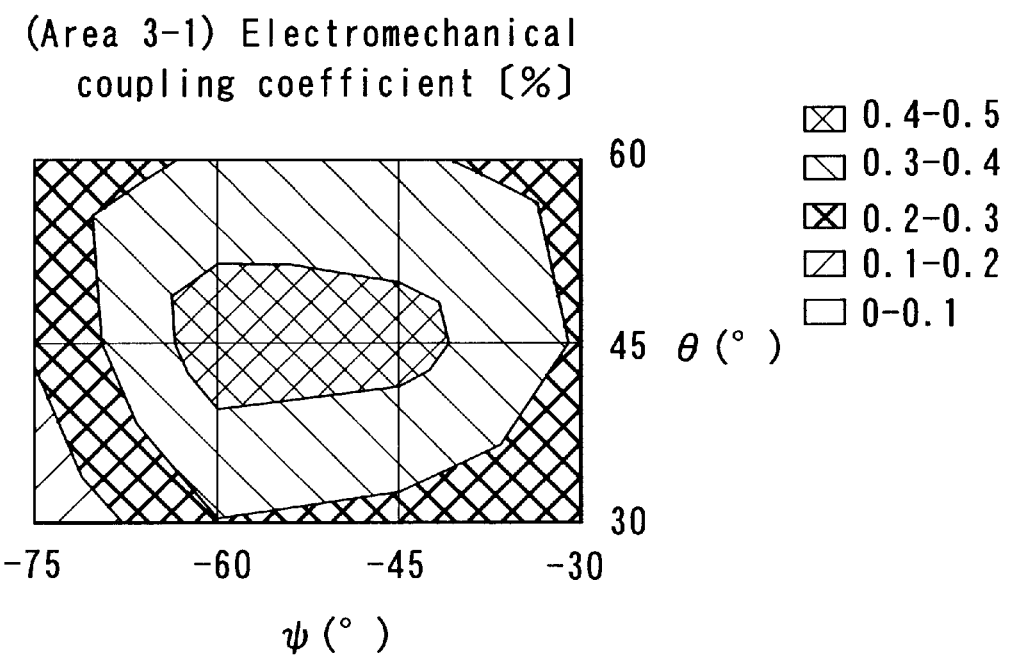
FIG. 20 is an explanatory diagram illustrating the relationship between $\theta$ and $\psi$, and the electromechanical coupling coefficient expressed in a two-dimensional manner based upon the test results shown in FIG. 6.

FIG. 6 is an explanatory diagram showing the test results corresponding to the area 3-1. FIG. 19 is an explanatory diagram illustrating the relationship between θ and ψ, and the SAW velocity expressed in a two-dimensional manner based upon the test results shown in FIG. 6. FIG. 20 is an explanatory diagram illustrating the relationship between θ and ψ, and the electromechanical coupling coefficient $k^2$ expressed in a two-dimensional manner based upon the test results shown in FIG. 6.

As apparent from FIG. 6, FIG. 19 and FIG. 20, when the angle φ is 15°, there are combinations of φ, θ, and ψ wherein the electromechanical coupling coefficient $k^2$ is 0.2% or more and the SAW velocity is 3100 m/s or less within the range where the angle θ is 30 to 60° and the angle ψ is −75 to −30°. Even if φ varies within the range of 15±5°, the same combinations as above are found. Furthermore, when the angle φ is 15°, there are combinations of φ, θ, and ψ wherein the electromechanical coupling coefficient $k^2$ is 0.4% or more within the range where the angle θ is 35 to 55° and the angle ψ is −60 to −40°. Even if φ varies within the range of 15±5°, the same combinations as above are found.

Figure 21:
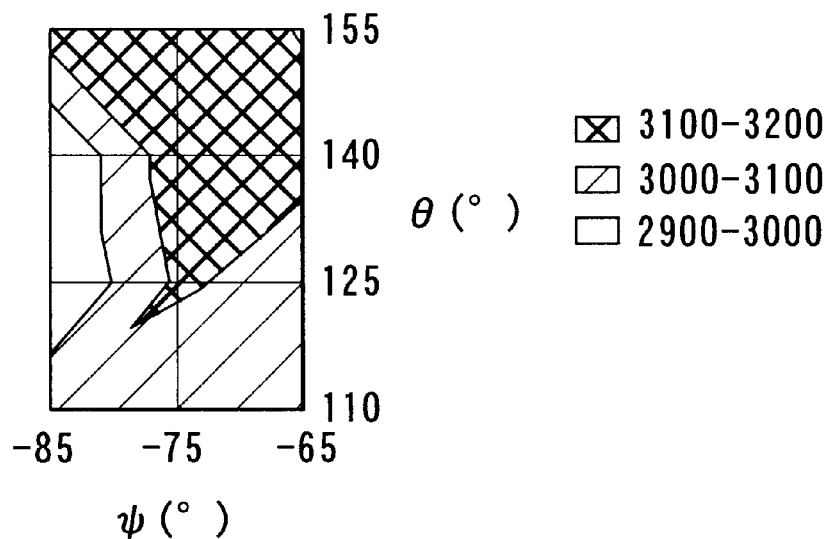
FIG. 21 is an explanatory diagram illustrating the relationship between θ and ψ, and the SAW velocity expressed in a two-dimensional manner based upon the test results shown in FIG. 7.
Figure 22:
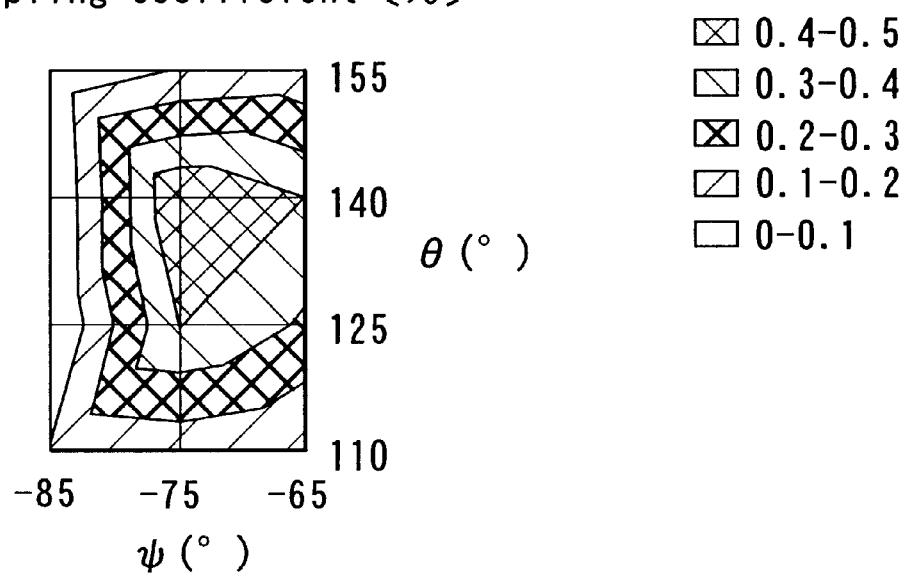
FIG. 22 is an explanatory diagram illustrating the relationship between θ and ψ, and the electromechanical coupling coefficient expressed in a two-dimensional manner based upon the test results shown in FIG. 7.

FIG. 7 is an explanatory diagram showing the test results corresponding to the area 3-2. FIG. 21 is an explanatory diagram illustrating the relationship between θ and ψ, and the SAW velocity expressed in a two-dimensional manner based upon the test results shown in FIG. 7. FIG. 22 is an explanatory diagram illustrating the relationship between θ and ψ, and the electromechanical coupling coefficient $k^2$ expressed in a two-dimensional manner based upon the test results shown in FIG. 7.

As apparent from FIG. 7, FIG. 21 and FIG. 22, when the angle φ is 15°, there are combinations of φ, θ, and ψ wherein the electromechanical coupling coefficient $k^2$ is 0.2% or more and the SAW velocity is 3200 m/s or less within the range where the angle θ is 110 to 155° and the angle ψ is −85 to −65°. Even if φ varies within the range of 15±5°, the same combinations as above are found. Furthermore, when the angle φ is 15°, there are combinations of φ, θ, and ψ wherein the electromechanical coupling coefficient $k^2$ is 0.4% or more within the range where the angle θ is 125 to 150° and the angle ψ is −80 to −65°. Even if φ varies within the range of 15±5°, the same combinations as above are found.

Figure 23:
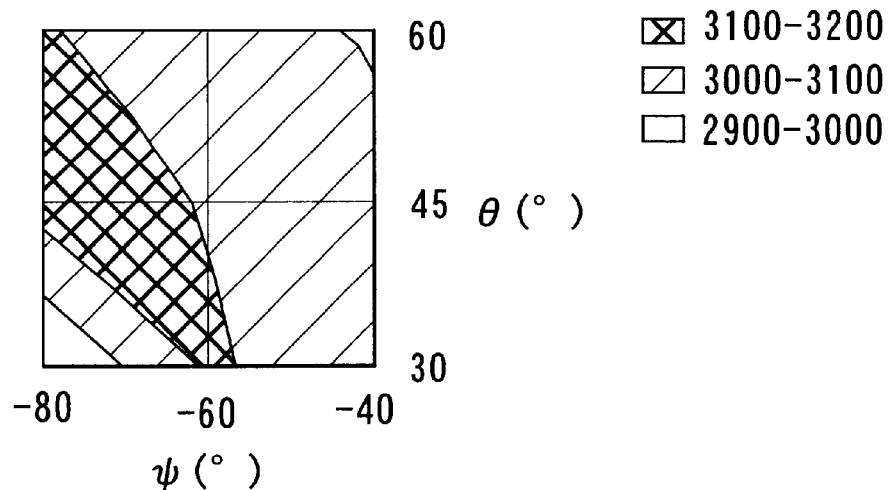
FIG. 23 is an explanatory diagram illustrating the relationship between θ and ψ, and the SAW velocity expressed in a two-dimensional manner based upon the test results shown in FIG. 8.
Figure 24:
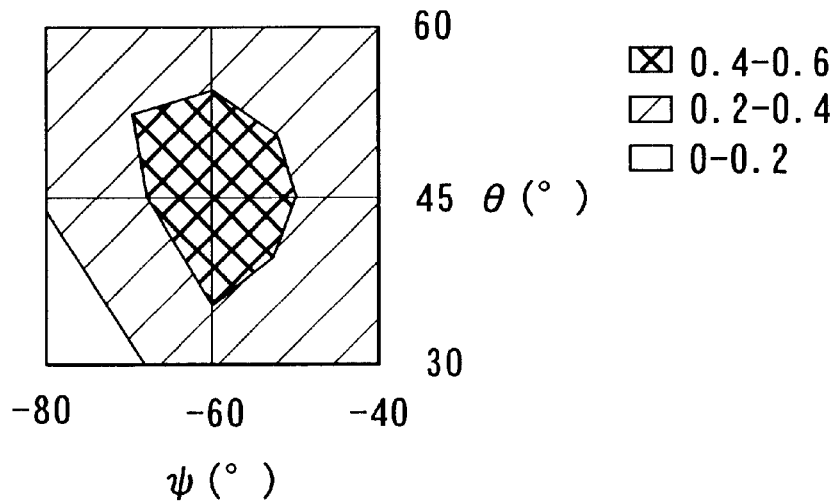
FIG. 24 is an explanatory diagram illustrating the relationship between θ and ψ, and the electromechanical coupling coefficient expressed in a two-dimensional manner based upon the test results shown in FIG. 8.

FIG. 8 is an explanatory diagram showing the test results corresponding to the area 4-1. FIG. 23 is an explanatory diagram illustrating the relationship between θ and ψ, and the SAW velocity expressed in a two-dimensional manner based upon the test results shown in FIG. 8. FIG. 24 is an explanatory diagram illustrating the relationship between θ and ψ, and the electromechanical coupling coefficient $k^2$ expressed in a two-dimensional manner based upon the test results shown in FIG. 8.

As apparent from FIG. 8, FIG. 23 and FIG. 24, when the angle φ is 25°, there are combinations of φ, θ, and ψ wherein the electromechanical coupling coefficient $k^2$ is 0.2% or more and the SAW velocity is 3200 m/s or less within the range where the angle θ is 30 to 60° and the angle ψ is −80 to −40°. Even if φ varies within the range of 25±5°, the same combinations as above are found. Furthermore, when the angle φ is 25°, there are combinations of φ, θ, and ψ wherein the electromechanical coupling coefficient $k^2$ is 0.5% or more within the range where the angle θ is 30 to 55° and the angle ψ is −75 to −50°. Even if φ varies within the range of 25±5°, the same combinations as above are found.

Figure 25:
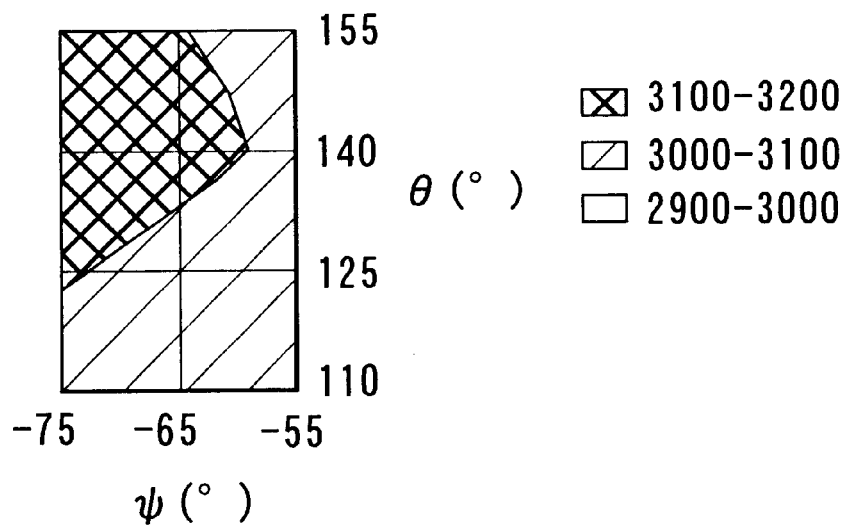
FIG. 25 is an explanatory diagram illustrating the relationship between θ and ψ, and the SAW velocity expressed in a two-dimensional manner based upon the test results shown in FIG. 9.
Figure 26:
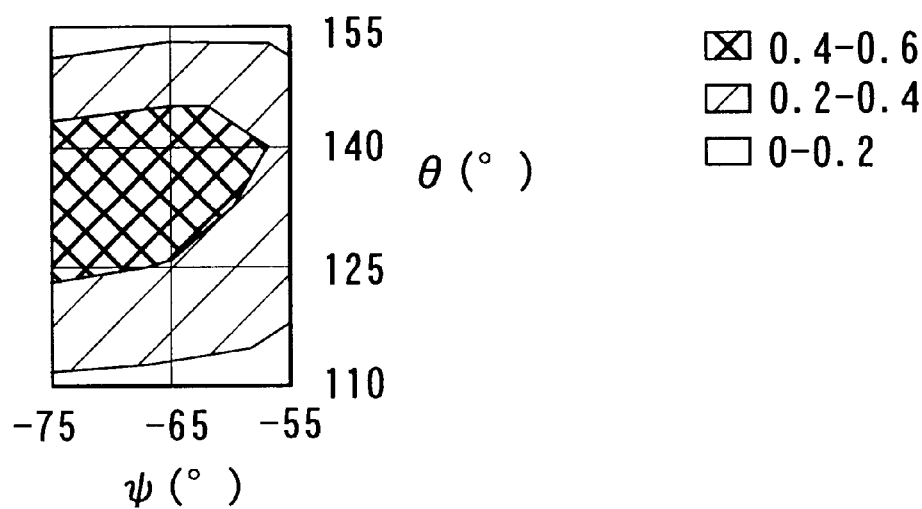
FIG. 26 is an explanatory diagram illustrating the relationship between θ and ψ, and the electromechanical coupling coefficient expressed in a two-dimensional manner based upon the test results shown in FIG. 9.

FIG. 9 is an explanatory diagram showing the test results corresponding to the area 4-2. FIG. 25 is an explanatory diagram illustrating the relationship between θ and ψ, and the SAW velocity expressed in a two-dimensional manner based upon the test results shown in FIG. 9. FIG. 26 is an explanatory diagram illustrating the relationship between θ and ψ, and the electromechanical coupling coefficient $k^2$ expressed in a two-dimensional manner based upon the test results shown in FIG. 9.

As apparent from FIG. 9, FIG. 25 and FIG. 26, when the angle φ is 25°, there are combinations of φ, θ, and ψ wherein the electromechanical coupling coefficient $k^2$ is 0.2% or more and the SAW velocity is 3200 m/s or less within the range where the angle θ is 110 to 155° and the angle ψ is −75 to −55°. Even if φ varies within the range of 25±5°, the same combinations as above are found. Furthermore, when the angle φ is 25°, there are combinations of φ, θ, and ψ wherein the electromechanical coupling coefficient $k^2$ is 0.4% or more within the range where the angle θ is 125 to 150° and the angle ψ is −75 to −60°. Even if φ varies within the range of 25±5°, the same combinations as above are found.

FIG. 10 is an explanatory diagram showing the test results corresponding to the area 5. As apparent from FIG. 10, there are combinations of φ, θ, and ψ wherein the electromechanical coupling coefficient $k^2$ is 0.2% or more and the SAW velocity is 3100 m/s or less within the range where the angle φ is 10 to 30°, the angle θ is 30 to 90°, and the angle ψ is −30 to 30°. Even if φ varies within the range of 5 to 10°, the same combinations as above are found.

Thus, it can be seen that a surface acoustic wave device having a sufficiently large electromechanical coupling coefficient and a low SAW velocity can be obtained when the cut angle of the piezoelectric substrate 1 cut out of the single crystal and the propagation direction of the surface acoustic wave are within the range of any of the areas 1-1, 1-2, 2-1, 2-2, 3-1, 3-2, 4-1, 4-2, and 5.

As has been described, according to this embodiment, it is possible to implement the piezoelectric substrate 1 having a large electromechanical coupling coefficient that is effective to achieve a wider passband and having a low SAW velocity that is effective to reduce the size of the surface acoustic wave device. Furthermore, use of such a piezoelectric substrate 1 to form a surface acoustic wave device makes it possible to achieve a wider passband and reduction in size of the surface acoustic wave device.

The invention is not limited to the above-described embodiment but various modifications are possible.

As described in the foregoing, according to the piezoelectric substrate for surface acoustic wave devices of the invention, it is possible to obtain a large electromechanical coupling coefficient that is effective to achieve a wider passband and a low SAW velocity that is effective to reduce the size of surface acoustic wave devices.

Furthermore, according to the surface acoustic wave device of the invention, since the piezoelectric substrate having a large electromechanical coupling coefficient and a low SAW velocity is used, it is possible to widen the passband and reduce the size of the acoustic wave device.

It is apparent that the present invention may be carried out in various modes and may be modified in various manners based on the foregoing description. Therefore, within the scope of equivalence of the scope of the following claims, the invention may be practiced otherwise than as specifically described.

What is claimed is:

1. A piezoelectric substrate for a surface acoustic wave device, the piezoelectric substrate being intended for use for a surface acoustic wave device having an interdigitated electrode formed on the piezoelectric substrate, the piezoelectric substrate being composed of a single crystal belonging to the point group 32, having a crystal structure of $Ca_3Ga_2Ge_4O_{14}$ type, containing Ca, Nb, Ga, Si and O as main components, and being represented by the chemical formula $Ca_3NbGa_3Si_2O_{14}$, wherein, when a cut angle at which the piezoelectric substrate is cut out of the single crystal and a propagation direction of a surface acoustic wave are represented in terms of Eulerian angles (φ, θ, ψ), φ, θ, and ψ are in an area in which:

φ=−5° to 5°,
θ=60° to 75°, and
ψ=0° to 10°.

2. A piezoelectric substrate for a surface acoustic wave device, the piezoelectric substrate being intended for use for a surface acoustic wave device having an interdigitated electrode formed on the piezoelectric substrate, the piezoelectric substrate being composed of a single crystal belonging to the point group 32, having a crystal structure of $Ca_3Ga_2Ge_4O_{14}$ type, containing Ca, Nb, Ga, Si and O as main components, and being represented by the chemical formula $Ca_3NbGa_3Si_2O_{14}$, wherein, when a cut angle at which the piezoelectric substrate is cut out of the single crystal and a propagation direction of a surface acoustic wave are represented in terms of Eulerian angles (φ, θ, ψ), φ,θ, and ψ are in an area in which:

$\phi = -5°$ to $5°$,
$\theta = 110°$ to $155°$, and
$\psi = 60°$ to $80°$.

3. A piezoelectric substrate for a surface acoustic wave device, the piezoelectric substrate being intended for use for a surface acoustic wave device having an interdigitated electrode formed on the piezoelectric substrate, the piezoelectric substrate being composed of a single crystal belonging to the point group 32, having a crystal structure of $Ca_3Ga_2Ge_4O_{14}$ type, containing Ca, Nb, Ga, Si and O as main components, and being represented by the chemical formula $Ca_3NbGa_3Si_2O_{14}$, wherein, when a cut angle at which the piezoelectric substrate is cut out of the single crystal and a propagation direction of a surface acoustic wave are represented in terms of Eulerian angles ($\phi$, $\theta$, $\psi$), and $\psi$ are in an area in which:
$\phi = 5°$ to $10°$ (excluding $5°$),
$\theta = 30°$ to $60°$, and
$\psi = -75°$ to $-30°$.

4. A piezoelectric substrate for a surface acoustic wave device, the piezoelectric substrate being intended for use for a surface acoustic wave device having an interdigitated electrode formed on the piezoelectric substrate, the piezoelectric substrate being composed of a single crystal belonging to the point group 32, having a crystal structure of $Ca_3Ga_2Ge_4O_{14}$ type, containing Ca, Nb, Ga, Si and O as main components, and being represented by the chemical formula $Ca_3NbGa_3Si_2O_{14}$, wherein, when a cut angle at which the piezoelectric substrate is cut out of the single crystal and a propagation direction of a surface acoustic wave are represented in terms of Eulerian angles ($\phi$, $\theta$, $\psi$), $\phi$, $\theta$, and $\psi$ are in an area in which:
$\phi = 5°$ to $10°$ (excluding $5°$),
$\theta = 110°$ to $155°$, and
$\psi = -85°$ to $-65°$.

5. A piezoelectric substrate for a surface acoustic wave device, the piezoelectric substrate being intended for use for a surface acoustic wave device having an interdigitated electrode formed on the piezoelectric substrate, the piezoelectric substrate being composed of a single crystal belonging to the point group 32, having a crystal structure of $Ca_3Ga_2Ge_4O_{14}$ type, containing Ca, Nb, Ga, Si and O as main components, and being represented by the chemical formula $Ca_3NbGa_3Si_2O_{14}$, wherein, when a cut angle at which the piezoelectric substrate is cut out of the single crystal and a propagation direction of a surface acoustic wave are represented in terms of Eulerian angles ($\phi$, $\theta$, $\psi$), $\phi$, $\theta$, and $\psi$ are in an area in which:
$\phi = 10°$ to $20°$ (excluding $10°$),
$\theta = 30°$ to $60°$, and
$\psi = -75°$ to $-30°$.

6. A piezoelectric substrate for a surface acoustic wave device, the piezoelectric substrate being intended for use for a surface acoustic wave device having an interdigitated electrode formed on the piezoelectric substrate, the piezoelectric substrate being composed of a single crystal belonging to the point group 32, having a crystal structure of $Ca_3Ga_2Ge_4O_{14}$ type, containing Ca, Nb, Ga, Si and O as main components, and being represented by the chemical formula $Ca_3NbGa_3Si_2O_{14}$, wherein, when a cut angle at which the piezoelectric substrate is cut out of the single crystal and a propagation direction of a surface acoustic wave are represented in terms of Eulerian angles ($\phi$, $\theta$, $\psi$), $\phi$, $\theta$, and $\psi$ are in an area in which:
$\phi = 10°$ to $20°$ (excluding $10°$),
$\theta = 110°$ to $155°$, and
$\psi = -85°$ to $-65°$.

7. A piezoelectric substrate for a surface acoustic wave device, the piezoelectric substrate being intended for use for a surface acoustic wave device having an interdigitated electrode formed on the piezoelectric substrate, the piezoelectric substrate being composed of a single crystal belonging to the point group 32, having a crystal structure of $Ca_3Ga_2Ge_4O_{14}$ type, containing Ca, Nb, Ga, Si and O as main components, and being represented by the chemical formula $Ca_3NbGa_3Si_2O_{14}$, wherein, when a cut angle at which the piezoelectric substrate is cut out of the single crystal and a propagation direction of a surface acoustic wave are represented in terms of Eulerian angles ($\phi$, $\theta$, $\psi$), $\phi$, $\theta$, and $\psi$ are in an area in which:
$\phi = 20°$ to $30°$ (excluding $20°$),
$\theta = 30°$ to $60°$, and
$\psi = -80°$ to $-40°$.

8. A piezoelectric substrate for a surface acoustic wave device, the piezoelectric substrate being intended for use for a surface acoustic wave device having an interdigitated electrode formed on the piezoelectric substrate, the piezoelectric substrate being composed of a single crystal belonging to the point group 32, having a crystal structure of $Ca_3Ga_2Ge_4O_{14}$ type, containing Ca, Nb, Ga, Si and O as main components, and being represented by the chemical formula $Ca_3NbGa_3Si_2O_{14}$, wherein, when a cut angle at which the piezoelectric substrate is cut out of the single crystal and a propagation direction of a surface acoustic wave are represented in terms of Eulerian angles ($\phi$, $\theta$, $\psi$), $\phi$, $\theta$, and $\psi$ are in an area in which:
$\phi = 20°$ to $30°$ (excluding $20°$),
$\theta = 110°$ to $155°$, and
$\psi = -75°$ to $-55°$.

9. A piezoelectric substrate for a surface acoustic wave device, the piezoelectric substrate being intended for use for a surface acoustic wave device having an interdigitated electrode formed on the piezoelectric substrate, the piezoelectric substrate being composed of a single crystal belonging to the point group 32, having a crystal structure of $Ca_3Ga_2Ge_4O_{14}$ type, containing Ca, Nb, Ga, Si and O as main components, and being represented by the chemical formula $Ca_3NbGa_3Si_2O_{14}$, wherein, when a cut angle at which the piezoelectric substrate is cut out of the single crystal and a propagation direction of a surface acoustic wave are represented in terms of Eulerian angles ($\phi$, $\theta$, $\psi$), $\phi$, $\theta$, and $\psi$ are in an area in which:
$\phi = 5°$ to $30°$ (excluding $5°$),
$\theta = 30°$ to $90°$, and
$\psi = -30°$ to $30°$.

10. A surface acoustic wave device having an interdigitated electrode formed on a piezoelectric substrate, the piezoelectric substrate being composed of a single crystal belonging to the point group 32, having a crystal structure of $Ca_3Ga_2Ge_4O_{14}$ type, containing Ca, Nb, Ga, Si and O as main components, and being represented by the chemical formula $Ca_3NbGa_3Si_2O_{14}$, wherein, when a cut angle at which the piezoelectric substrate is cut out of the single crystal and a propagation direction of a surface acoustic wave are represented in terms of Eulerian angles ($\phi$, $\theta$, $\psi$), $\phi$, $\theta$, and $\psi$ are in an area in which:
$\phi = -5°$ to $5°$,
$\theta = 60°$ to $75°$, and
$\psi = 0°$ to $10°$.

11. A surface acoustic wave device having an interdigitated electrode formed on a piezoelectric substrate, the piezoelectric substrate being composed of a single crystal belonging to the point group 32, having a crystal structure of $Ca_3Ga_2Ge_4O_{14}$ type, containing Ca, Nb, Ga, Si and O as main components, and being represented by the chemical formula $Ca_3NbGa_3Si_2O_{14}$, wherein, when a cut angle at which the piezoelectric substrate is cut out of the single crystal and a propagation direction of a surface acoustic wave are represented in terms of Eulerian angles ($\phi$, $\theta$, $\psi$), $\phi$, $\theta$, and $\psi$ are in an area in which:
$\phi = -5°$ to $5°$,
$\theta = 110°$ to $155°$, and
$\psi = 60°$ to $80°$.

12. A surface acoustic wave device having an interdigitated electrode formed on a piezoelectric substrate, the piezoelectric substrate being composed of a single crystal belonging to the point group 32, having a crystal structure of $Ca_3Ga_2Ge_4O_{14}$ type, containing Ca, Nb, Ga, Si and O as main components, and being represented by the chemical formula $Ca_3NbGa_3Si_2O_{14}$, wherein, when a cut angle at which the piezoelectric substrate is cut out of the single crystal and a propagation direction of a surface acoustic wave are represented in terms of Eulerian angles ($\phi$, $\theta$, $\psi$), $\phi$, $\theta$, and $\psi$ are in an area in which:
$\phi = 5°$ to $10°$ (excluding $5°$),
$\theta = 30°$ to $60°$, and
$\psi = -75°$ to $-30°$.

13. A surface acoustic wave device having an interdigitated electrode formed on a piezoelectric substrate, the piezoelectric substrate being composed of a single crystal belonging to the point group 32, having a crystal structure of $Ca_3Ga_2Ge_4O_{14}$ type, containing Ca, Nb, Ga, Si and O as main components, and being represented by the chemical formula $Ca_3NbGa_3Si_2O_{14}$, wherein, when a cut angle at which the piezoelectric substrate is cut out of the single crystal and a propagation direction of a surface acoustic wave are represented in terms of Eulerian angles ($\phi$, $\theta$, $\psi$), $\phi$, $\theta$, and $\psi$ are in an area in which:
$\phi = 5°$ to $10°$ (excluding $5°$),
$\theta = 110°$ to $155°$, and
$\psi = -85°$ to $-65°$.

14. A surface acoustic wave device having an interdigitated electrode formed on a piezoelectric substrate, the piezoelectric substrate being composed of a single crystal belonging to the point group 32, having a crystal structure of $Ca_3Ga_2Ge_4O_{14}$ type, containing Ca, Nb, Ga, Si and O as main components, and being represented by the chemical formula $Ca_3NbGa_3Si_2O_{14}$, wherein, when a cut angle at which the piezoelectric substrate is cut out of the single crystal and a propagation direction of a surface acoustic wave are represented in terms of Eulerian angles ($\phi$, $\theta$, $\psi$), $\phi$, $\theta$, and $\psi$ are in an area in which:
$\phi = 10°$ to $20°$ (excluding $10°$),
$\theta = 30°$ to $60°$, and
$\psi = -75°$ to $-30°$.

15. A surface acoustic wave device having an interdigitated electrode formed on a piezoelectric substrate, the piezoelectric substrate being composed of a single crystal belonging to the point group 32, having a crystal structure of $Ca_3Ga_2Ge_4O_{14}$ type, containing Ca, Nb, Ga, Si and O as main components, and being represented by the chemical formula $Ca_3NbGa_3Si_2O_{14}$, wherein, when a cut angle at which the piezoelectric substrate is cut out of the single crystal and a propagation direction of a surface acoustic wave are represented in terms of Eulerian angles ($\phi$, $\theta$, $\psi$), $\phi$, $\theta$, and $\psi$ are in an area in which:
$\phi = 10°$ to $20°$ (excluding $10°$),
$\theta = 110°$ to $155°$, and
$\psi = -85°$ to $-65°$.

16. A surface acoustic wave device having an interdigitated electrode formed on a piezoelectric substrate, the piezoelectric substrate being composed of a single crystal belonging to the point group 32, having a crystal structure of $Ca_3Ga_2Ge_4O_{14}$ type, containing Ca, Nb, Ga, Si and O as main components, and being represented by the chemical formula $Ca_3NbGa_3Si_2O_{14}$, wherein, when a cut angle at which the piezoelectric substrate is cut out of the single crystal and a propagation direction of a surface acoustic wave are represented in terms of Eulerian angles ($\phi$, $\theta$, $\psi$), $\phi$, $\theta$, and $\psi$ are in an area in which:
$\phi = 20°$ to $30°$ (excluding $20°$),
$\theta = 30°$ to $60°$, and
$\psi = -80°$ to $-40°$.

17. A surface acoustic wave device having an interdigitated electrode formed on a piezoelectric substrate, the piezoelectric substrate being composed of a single crystal belonging to the point group 32, having a crystal structure of $Ca_3Ga_2Ge_4O_{14}$ type, containing Ca, Nb, Ga, Si and O as main components, and being represented by the chemical formula $Ca_3NbGa_3Si_2O_{14}$, wherein, when a cut angle at which the piezoelectric substrate is cut out of the single crystal and a propagation direction of a surface acoustic wave are represented in terms of Eulerian angles ($\phi$, $\theta$, $\psi$), $\phi$, $\theta$, and $\psi$ are in an area in which:
$\phi = 20°$ to $30°$ (excluding $20°$),
$\theta = 110°$ to $155°$, and
$\psi = -75°$ to $-55°$.

18. A surface acoustic wave device having an interdigitated electrode formed on a piezoelectric substrate, the piezoelectric substrate being composed of a single crystal belonging to the point group 32, having a crystal structure of $Ca_3Ga_2Ge_4O_{14}$ type, containing Ca, Nb, Ga, Si and O as main components, and being represented by the chemical formula $Ca_3NbGa_3Si_2O_{14}$, wherein, when a cut angle at which the piezoelectric substrate is cut out of the single crystal and a propagation direction of a surface acoustic wave are represented in terms of Eulerian angles ($\phi$, $\theta$, $\psi$), $\phi$, $\theta$, and $\psi$ are in an area in which:
$\phi = 5°$ to $30°$ (excluding $5°$),
$\theta = 30°$ to $90°$, and
$\psi = -30°$ to $30°$.

* * * * *

UNITED STATES PATENT AND TRADEMARK OFFICE
CERTIFICATE OF CORRECTION

PATENT NO. : 6,696,736 B2
DATED : February 24, 2004
INVENTOR(S) : Kenji Inoue et al.

It is certified that error appears in the above-identified patent and that said Letters Patent is hereby corrected as shown below:

Column 5,
Line 65, replace "100" with -- $\phi$ --.

Column 9,
Line 30, after "$\theta$" insert -- is --.

Signed and Sealed this

Twenty-second Day of June, 2004

JON W. DUDAS
*Acting Director of the United States Patent and Trademark Office*